US010204492B2

(12) United States Patent
Thizon

(10) Patent No.: US 10,204,492 B2
(45) Date of Patent: Feb. 12, 2019

(54) VISUAL SIGNALLING DEVICE FOR CONTROL AND/OR DISPLAY UNIT

(71) Applicant: Schneider Electric Industries SAS, Rueil-Malmaison (FR)

(72) Inventor: Patrice Thizon, Ruelle-sur-Touvre (FR)

(73) Assignee: SCHNEIDER ELECTRIC INDUSTRIES SAS, Rueil Malmaison (FR)

( * ) Notice: Subject to any disclaimer, the term of this patent is extended or adjusted under 35 U.S.C. 154(b) by 0 days.

(21) Appl. No.: 15/784,808

(22) Filed: Oct. 16, 2017

(65) Prior Publication Data
US 2018/0130317 A1 May 10, 2018

(30) Foreign Application Priority Data
Nov. 8, 2016 (FR) .................................... 16 60766

(51) Int. Cl.
H01H 13/02 (2006.01)
G08B 5/36 (2006.01)
H05K 1/18 (2006.01)
H05K 5/00 (2006.01)

(52) U.S. Cl.
CPC ............. G08B 5/36 (2013.01); H01H 13/023 (2013.01); H05K 1/18 (2013.01); H05K 5/0017 (2013.01); H01H 2219/0622 (2013.01); H05K 2201/10106 (2013.01)

(58) Field of Classification Search
CPC ........... H01H 13/02; H01H 13/23; G08B 5/36
See application file for complete search history.

(56) References Cited

U.S. PATENT DOCUMENTS 4,495,391 A * 1/1985 Kitao .................. H01H 15/102
200/284
4,933,523 A * 6/1990 Honda ................. H01H 1/5805
200/314
4,968,860 A * 11/1990 Shinohara ........... H01H 13/023
200/314

(Continued)

FOREIGN PATENT DOCUMENTS

DE 102 25 016 A1 1/2004
DE 10 2015 210 620 B3 10/2016

(Continued)

OTHER PUBLICATIONS

French Preliminary Search Report dated Aug. 21, 2017 in French Application 16 60766 filed on Nov. 8, 2016 (with English Translation of Categories of Cited Documents and Written Opinion).

Primary Examiner — Andrew W Bee
(74) Attorney, Agent, or Firm — Oblon, McClelland, Maier & Neustadt, L.L.P.

(57) ABSTRACT

A visual signalling device is for a control and/or display unit provided with a body and intended to be mounted through an opening formed in a wall. The device includes a support element including a platform having an opening intended to be passed through by the body of the control and/or display unit and a first face intended to be facing a face of the wall, a visual signalling assembly fastened on the first face of the platform and intended to produce a luminous signal, an electrical connection block intended to supply power to the visual signalling assembly.

10 Claims, 7 Drawing Sheets

(56) References Cited

U.S. PATENT DOCUMENTS

| | | |
|---|---|---|
| 2007/0062794 A1 | 3/2007 | Rainer et al. |
| 2007/0193867 A1 | 8/2007 | Lorenzo Riera et al. |
| 2010/0220495 A1 | 9/2010 | Truesdale et al. |
| 2015/0114810 A1* | 4/2015 | Tanoue ................ H01H 9/161 200/314 |
| 2015/0170850 A1* | 6/2015 | Kirita ................... H01H 13/52 200/314 |

FOREIGN PATENT DOCUMENTS

| | | |
|---|---|---|
| EP | 1 821 326 A1 | 8/2007 |
| WO | WO 2005/050686 A1 | 6/2005 |

* cited by examiner

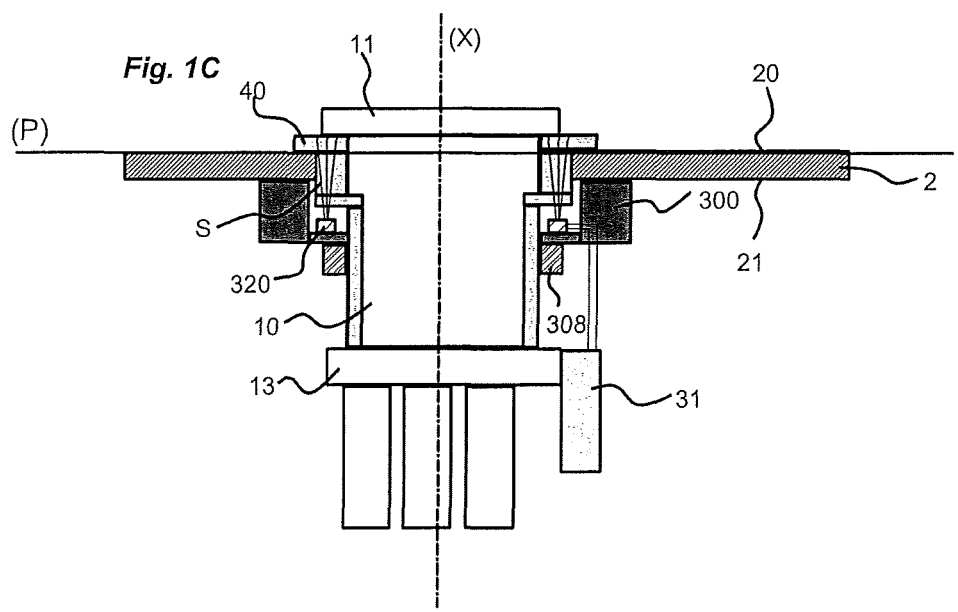

VISUAL SIGNALLING DEVICE FOR CONTROL AND/OR DISPLAY UNIT

TECHNICAL FIELD OF THE INVENTION

The present invention relates to a visual signalling device and to a control and/or display assembly including said visual signalling device.

PRIOR ART

Various control and/or display units are known in the industrial field. In the control units, a distinction is drawn for example between pushbuttons, rotary buttons, rotary key buttons or emergency stop buttons. These various units are intended to generate a command in an electrical installation. Indicator lights also exist, the function of which is simply to light up in order to signal a particular operating state to the operator. Certain control units of pushbutton or rotary button type also incorporate a display function.

These control and/or display units are fastened through a wall, such as for example the door of an electrical enclosure. In order to fasten such a control unit, an opening of a standard diameter is formed through the wall. The unit has a body made of plastic or metal material that is driven axially into said opening until coming into abutment therewith. It thus has a visible front part on one side of the wall and an invisible rear part situated on the other side of the wall. Fastening means interacting with its rear part enable it to be fastened through the opening.

Various signalling solutions have already been proposed in the prior art for visually signalling a particular state of a control and/or display unit.

The signalling element may be housed in the body of the device. It may also have, as described in patent application EP0517932A1, an annular configuration extending around the main body of the pushbutton. Light-emitting diodes of the signalling element are then distributed on a plate positioned around the body of the button. In this last solution, it has been observed that these various signalling configurations may impair the effectiveness of the emergency stop button, as the signalling function is not sufficiently dissociated from the control function.

Moreover, the visual signalling solutions integrated into the body of the control and/or display units are often obtrusive, as they occupy the central axis. In addition, in the event of a malfunction, it is the entire unit that has to be dismounted and replaced. Finally, conventional control units, control units provided with a display function and display units have to be separate commercial products that it is necessary to manage separately.

In order to mitigate some of these drawbacks, it has already been proposed to implement the display function with the aid of an accessory that adapts to a control unit that does not have such a function. This type of accessory takes the form of a luminous ring that is positioned on the side of the front part of the unit, between its control head and the wall. A power supply block, for its part, is positioned behind the wall in order to supply power to light-emitting diodes of the luminous ring. Patent application EP2299462A1 describes such a solution.

However, this solution proves impractical. It is obtrusive and requires passing a wire between the front and the rear of the wall, this being incompatible with usage restrictions in the industrial sector.

Patent application US2010/220945A1 also describes a pushbutton architecture having a luminous signalling solution.

There continues to be a need to have a visual signalling solution that is not obtrusive, is easy to add to an existing control and/or display unit, and which potentially makes it possible to assign other functions to the control and/or display unit.

SUMMARY OF THE INVENTION

The invention thus relates to a visual signalling device for a control and/or display unit provided with a body and intended to be mounted through an opening formed in a wall, said device including:

A support element comprising a platform having an opening intended to be passed through by the body of said control and/or display unit and a first face intended to be facing a face of the wall, A visual signalling assembly fastened on the first face of said platform and comprising at least one light-emitting diode intended to produce a luminous signal, An electrical connection block intended to supply power to said visual signalling assembly, Said platform including at least one radial passage through which said at least one light-emitting diode emits said luminous signal.

According to one particular embodiment, the visual signalling assembly includes an electronic board to which said at least one light-emitting diode is soldered.

According to a first implementation variant, said at least one light-emitting diode is oriented in such a way as to emit its luminous signal in a main direction situated in a plane that is transverse with respect to the axis of the opening.

According to one particular feature, said opening of the device has a circular outline.

According to another particular feature, the platform includes fastening means designed to interact with corresponding fastening means of the electrical connection block.

According to another particular feature, the device includes a clamping ring integral with said platform.

Another aim of the invention consists in proposing a control and/or display assembly, which makes it possible to provide satisfactory lighting, with minimum bulk in terms of height, and which is able to provide certain additional functionalities. This other aim is achieved by a control and/or display assembly that comprises:

A control and/or display unit comprising a body defined along an axis, a control and/or display head mounted on said body, the control and/or display unit including a bezel designed to bear against a first face of a wall, termed external face, defining a bearing plane, Said assembly including:

A visual signalling device in accordance with the one defined above, the support element of which interacts with said body of the control and/or display unit, An element made of translucent or transparent material and designed to receive said luminous signal emitted by the visual signalling assembly of said visual signalling device and to propagate said luminous signal, Said element made of translucent or transparent material including a first zone arranged facing the radial passage through which said at least one light-emitting diode emits said luminous signal, for receiving said luminous signal below said bearing plane, and a second zone extending the first zone as far as the bearing plane or above the bearing plane.

According to one particular embodiment, the element made of translucent or transparent material is formed of a component moulded over the body of said control and/or display unit.

According to another particular embodiment, the element made of translucent or transparent material is formed at least partly by the body of said control and/or display unit.

According to another particular feature, the assembly includes a clamping ring designed to hold the visual signalling device so that it bears against a second face of the wall, termed internal face, opposite said external face.

BRIEF DESCRIPTION OF THE FIGURES

Other features and advantages will appear in the following detailed description given with regard to the appended drawings, in which:

FIGS. 1A to 1D schematically illustrate the principle of operation of the visual signalling device of the invention in a plurality of distinct configurations.

DETAILED DESCRIPTION OF AT LEAST ONE EMBODIMENT

Figure 1A:
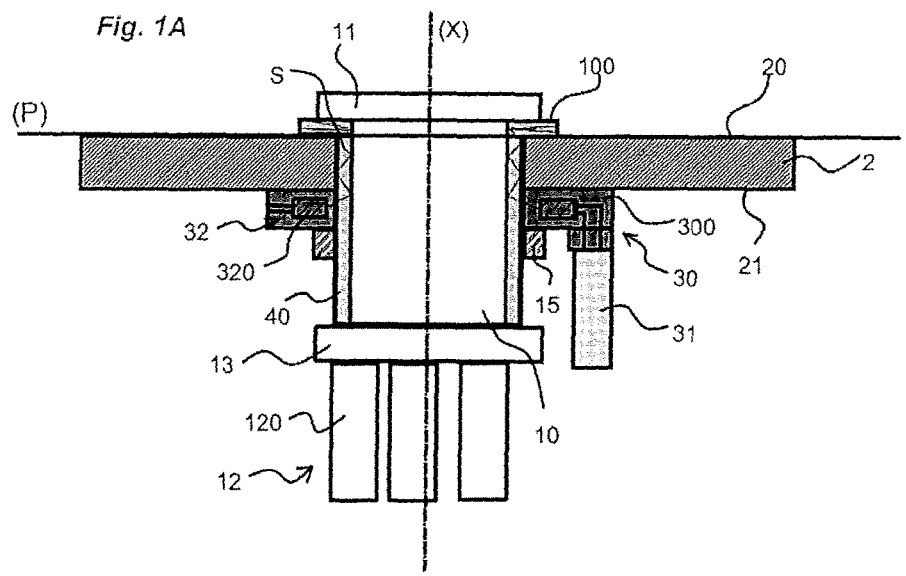

In the remainder of the description, the terms "top", "bottom", "higher", "lower", "above", "below" are to be understood taking the axis (X) as reference, which axis is visible in the appended figures and shown in a vertical direction.

A definition is also given of the front part of the wall, which corresponds to the part visible to a user, and the rear part of the wall, which corresponds to the part invisible to the user.

The invention is linked to the field of control and/or display units of industrial type, which are grouped together in a field conventionally termed "button devices". Control unit is understood to mean, in a non-exhaustive manner, a pushbutton, a rotary button, a rotary key button, an emergency stop button, etc. Display unit is understood to mean for example an indicator light having a cap of translucent or transparent colour and able to allow a luminous signal to pass to the outside. Moreover, it is known that a control unit such as defined above is also able to be provided with a display function.

FIGS. 1A to 1D illustrate the principle of the invention. All the details of implementation, in particular of the control unit, are not necessarily visible in these figures. FIGS. 4 to 6 are more detailed and show more specific embodiments of the invention.

A control and/or display unit is mounted through engagement in an opening formed through a metal wall 2, such as for example the door of an electrical enclosure or a control console. For a pushbutton or rotary button, the opening is for example of a normalized diameter equal to 22 mm or 25.5 mm. The wall includes a first face 20, termed external face, and a second face 21, termed internal face.

In a conventional manner, a control and/or display unit includes a body 10 taking the form of a component that is tubular about an axis (coincident with the axis (X) in the figures) and intended to be inserted along its axis through said opening in the wall 2. Along its axis, the body 10 includes a lower part and an upper part, which may be separated from one another by a shoulder. The upper part is provided with an annular bezel 100 intended to bear against a first face, termed external face, of the wall 2 around the opening, such that its position defines, in a bearing plane P against the external face 20 of the wall, the visible part of the unit, which part is situated on a first side of the wall (in front of the wall) with respect to the invisible part of the unit, which part is situated on a second side of the wall 2 (behind the wall). A gasket is for example positioned between the bezel 100 and the surface of the wall 2.

A control and/or display unit includes means for fastening to said wall 2. These fastening means are not a subject of the present application, and they may be of various types. The fastening means used are for example formed by a screw 15 screwed onto an external thread formed on the lower part of the tubular body of the device or, as described in patent EP0889564B1, formed by a baseplate that is joined to the tubular body, this baseplate bearing latching means such as grub screws or pivoting latching arms that are manoeuvred by way of a screw. In the appended figures, various fastening means are shown.

More particularly, a control unit such as for example a pushbutton, an emergency stop button or a rotary button includes a control head 11 mounted on the body and comprising a button that is able to be actuated.

A control unit also includes an electrical contacts unit. The contacts unit 12 includes one or more electrical contact blocks 120. Each electrical contact block includes a mobile contact switch that is able to be actuated by pressing on the button of the control unit. An emergency stop button thus includes at least one electrical contact block, the switch of which is configured in normally closed (NC) mode.

In order to carry the contacts unit, a control unit generally includes a fastening baseplate 13 of rectangular form, for example. This baseplate 13 includes a central opening intended to be passed through by the lower part of the tubular body 10 and fastening means that serve to carry the electrical contacts blocks 120 in a removable manner. Depending on the configuration, this baseplate 13 may be integral with the fastening means or independent of these fastening means. In the latter case, the lower part of the control unit latches into said baseplate. In a control unit, the action on the button of the control head 11 actuates the switches of the contact blocks of the contact unit. The button of the control head may be made of a translucent or transparent material enabling light to pass through, conferring a visual signalling function on the control unit.

A display unit of the indicator light type, for its part, includes a head provided with a translucent or transparent cap 14, enabling the light to pass through. The cap may be coloured.

The invention consists in proposing a new principle of visual signalling for control and/or display units such as described above. The solution of the invention potentially makes it possible to no longer occupy the central part of the unit into which a light-emitting diode is generally integrated in order to provide lighting for the unit, and to propose other functionalities that will be detailed below.

Thus, the visual signalling device of the invention is composed of at least three main parts:
A support element 30,
An electrical connection block 31,
A visual signalling assembly 32 intended to generate at least one luminous signal and fastened on said support element 30.

The electrical connection block 31 and the visual signalling assembly 32 are connected electrically through electrical links and contacts.

Figure 2A:
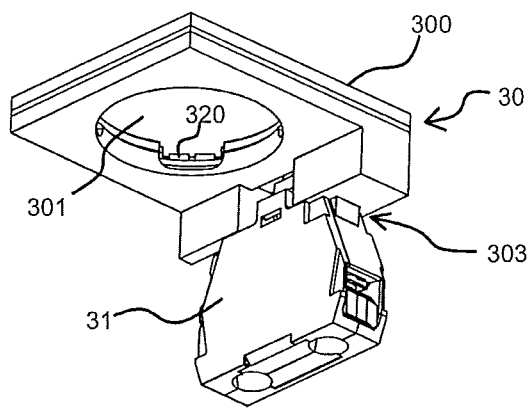
FIGS. 2A to 2C show a first embodiment of the visual signalling device of the invention.
Figure 2B:
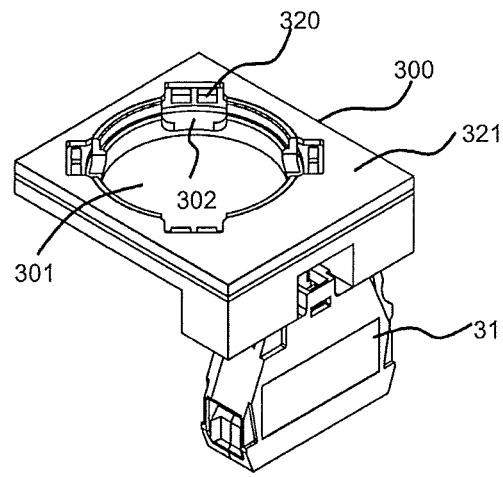
Figure 2C:
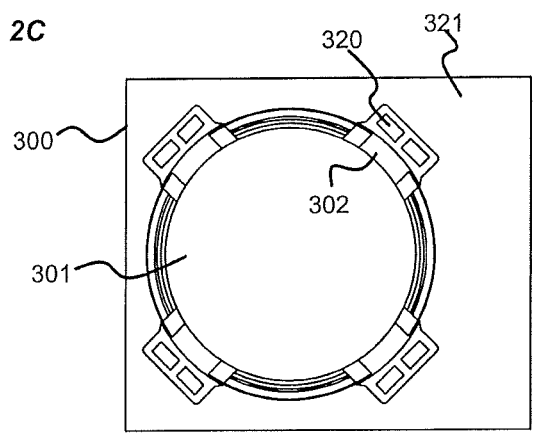
Figure 3A:
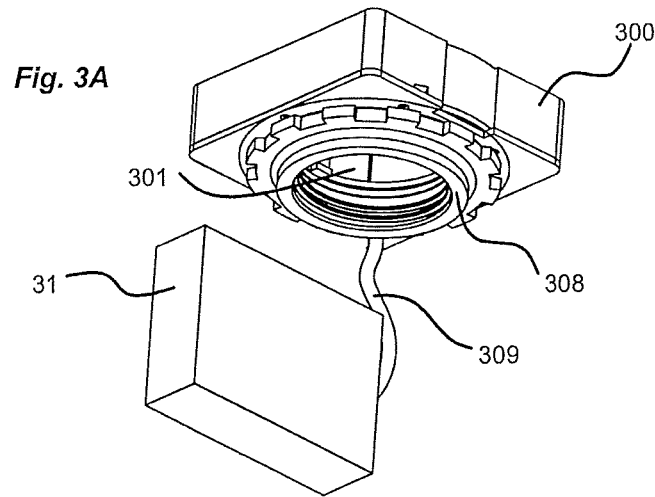
FIGS. 3A to 3C show a second embodiment of the visual signalling device of the invention.
Figure 3B:
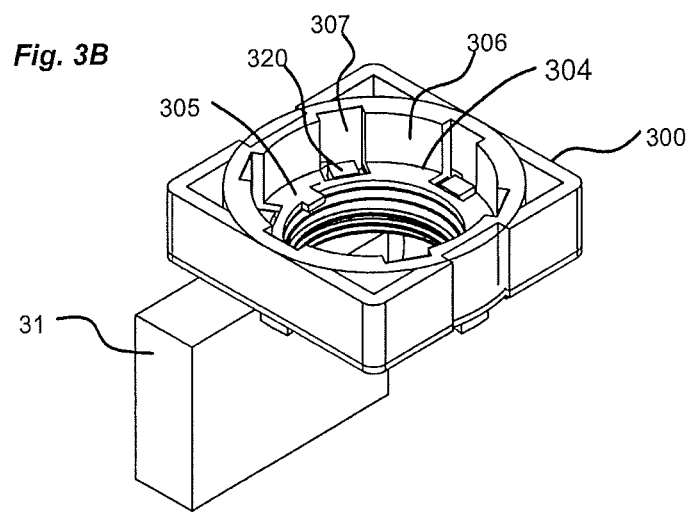
Figure 3C:
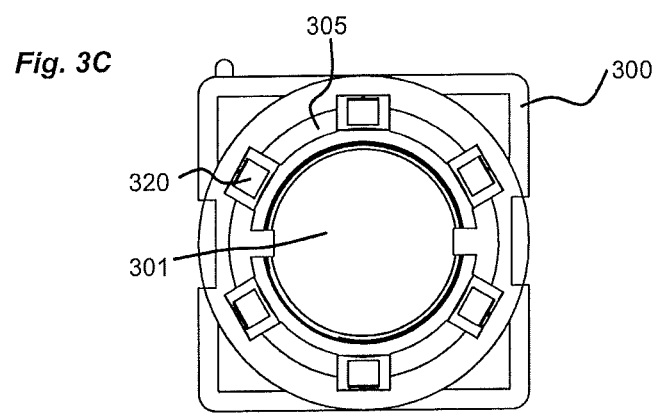

In FIGS. 2A to 2C, the visual signalling device is shown in a first embodiment and, in FIGS. 3A to 3C, the visual signalling device is shown in a second embodiment.

In these two embodiments, the support element 30 includes a platform 300, for example of rectangular external shape and having two support faces that are parallel to one another and to a plane P and separated from one another by the thickness of the platform, thus forming a housing. The platform is provided with an opening 301 of tubular shape, formed along an axis perpendicular to said plane P, through the thickness of the platform. Said opening 301 is of generally circular shape and is preferably formed in the centre of the platform. The opening thus has a cylindrical internal wall.

The electrical connection block 31 advantageously takes the same form as a conventional contact block of a contacts unit, such as described above. It includes in particular a housing and fastening means that are identical to those of conventional contact blocks.

The electrical connection block advantageously includes means for managing the visual signalling assembly. These management means are for example grouped together on an electronic board housed in the housing of the electrical connection block. It includes terminals for electrically connecting to an electric power supply source. In this case, the electrical link is formed by wires extending from the terminals of the electrical connection block to the power supply source. As an implementation variant, the electrical connection block may incorporate a source for supplying electric power to the visual signalling assembly. This will be an electric battery, for example. The electrical connection block advantageously includes protective components for industrial and electromagnetically noisy environments.

The visual signalling assembly 32 includes, for its part, one or more light-emitting diodes 320. The diodes are made integral with the platform 300 and supplied with power by the electrical connection block 31 described above. The platform 300 advantageously includes a plurality of separate locations each designed to receive at least one light-emitting diode 320. These locations are distributed over the perimeter of the opening 301 of the platform.

The light-emitting diodes 320 are all situated behind the wall 2.

According to the applications that are envisaged, the visual signalling assembly of the device may be controlled in accordance with various variants:

The light-emitting diodes 320 may all be controlled at the same time. The latter are then connected in one and the same control circuit, for example in parallel in said circuit. The visual signalling assembly 32 thus includes two electrical contact terminals that are connected electrically to two corresponding terminals of the electrical connection block.

The light-emitting diodes 320 are controlled independently or in groups (a group of diodes including at least diodes and fewer diodes than the total number of diodes). This is then what is termed "point-to-point" control, in which each group of diodes is able to be addressed individually. In this case, the visual signalling assembly includes a separate electrical terminal for each group of diodes and a common terminal. The electrical connection block has the same configuration.

The state of each light-emitting diode 320 of the device, that is to say its turned-on or turned-off state, is able to be controlled in accordance with one of the implementation variants below:

Its state is for example controlled by a switch present in the electrical connection block 31. This switch may be linked mechanically to at least one mobile contact switch of a contact block of the contacts unit.

Its state is for example controlled directly by a programmable logic controller that includes an output module able to generate a command to activate or to deactivate the light-emitting diode. If the light-emitting diodes are controlled independently, a separate command will have to be generated for each light-emitting diode. In this case, the command will act on a control transistor of the circuit for supplying power to the diode.

According to the first embodiment shown in FIGS. 2A to 2C, on its first support face, termed upper face, the platform 300 is provided with a recess intended to receive the visual signalling assembly 32.

The recess in the platform is preferably formed over the entire periphery of the opening 301.

The recess of the platform furthermore defines, along the edge of the opening, said separate locations.

The visual signalling assembly 32 is arranged in said recess of the platform. It advantageously includes a plurality of light-emitting diodes 320 that are each intended to be positioned in a separate location in the recess.

The light-emitting diodes may be connected in a power supply circuit linked to the electrical connection block. A particular connection system may be provided for their connection.

Moreover, in an advantageous manner, the visual signalling assembly 32 may include an electronic board 321 of a shape designed to be positioned in the recess of the platform, closely matching the external outline of the upper face of the platform and with a cut-out in its central part so as to closely match the outline of the opening 301. In the visual signalling assembly, the light-emitting diodes 320 are then soldered to the electronic board 321, in such a way as to each be positioned in a separate location on the recess. The electronic board 321 ideally has electrical contacts to which corresponding electrical contacts of the connection block are connected.

In each of the locations, the platform 300 includes a radial passage 302 formed through the housing of the platform. The radial passages are thus distributed over the perimeter of the opening 301. At least one separate light-emitting diode 320 is placed facing one of the radial passages, so as to be able to generate a luminous signal through said passage. Each diode 320 thus generates a luminous signal S that is guided by a radial passage in a main direction oriented towards the centre of the opening, perpendicular to the axis of the opening and parallel to said plane P.

According to the first embodiment, the platform 300 includes mechanical fastening means 303 that are arranged on its second support face and intended to interact with corresponding fastening means of the electrical connection block 31 in order to fasten the electrical connection block. Advantageously, when the electrical connection block 31 is fastened, an electrical connection is also produced. Fastening of the electrical connection block 31 is for example carried out on the second support face, along one of the external edges of the platform 300.

Fastening of the platform with respect to the control unit may be carried out in accordance with various implementation variants. One advantageous solution consists in positioning the platform between the means for fastening the control and/or display unit and the internal face 21 of the wall 2. These fastening means may be a ring 15 (corresponding to the screw described above) for clamping the unit and the internal face of the wall. This clamping ring 15 is for example screwed onto an external thread present on the body of the unit.

According to the second implementation variant of the device shown in FIGS. 3A to 3C, on its first support face, termed upper face, in order to define each location described above, the platform 300 includes a cavity 304 arranged around its opening 301. This cavity 304 defines a first transverse surface 305 at the periphery of the opening 301 and a second cylindrical annular surface 306. The first surface 305 has a plurality of recesses distributed at regular intervals and each intended to receive at least one separate light-emitting diode 320 of the visual signalling assembly. Each recess is extended by a passage 307 formed in the second surface 306 and oriented in the axial direction. Each diode 320 housed in a separate location thus generates a luminous signal that is guided in a main axial direction, that is to say parallel to the axis of the opening.

According to this second embodiment, the support element includes an integrated clamping ring 308 arranged in the extension of the opening 301 formed through the platform. This ring 308 provides an internal thread making it possible to screw the support element onto the body of the control and/or display unit. This ring is fastened to the second support face, termed lower face, of the platform. The assembly formed of the platform and of the clamping ring 308 thus forms a single component, for example obtained by moulding using a plastic material.

According to this second embodiment, the electrical connection block 31 is not fastened directly to the platform. It is linked by a cable 309 to a connection system of the visual signalling assembly.

The visual signalling device described above, according to the first embodiment or the second embodiment, is intended to interact with the control and/or display unit with a view to providing it with visual signalling means, and to form a complete control and/or display assembly.

According to the invention, the visual signalling device is positioned on the second side of the wall and is therefore situated in the invisible part of the exterior.

According to one aspect of the invention, the control and/or display assembly also includes at least one element 40 made of translucent or transparent material and through which at least one luminous signal generated by the visual signalling device is emitted. Each element 40 made of translucent or transparent material includes at least one first zone situated below the bearing plane of the unit and a second zone, continuously extending said first zone and situated at the level of the bearing plane or above said bearing plane. Each element 40 made of translucent or transparent material is thus intended to propagate a luminous signal S received by its first zone to its second zone. Depending on the configuration adopted for the emission of the luminous signal S, the first zone of each element 40 made of translucent or transparent material may extend more or less towards the rear.

In the case where the signalling device includes at least one light-emitting diode 320 arranged in such a way as to emit a luminous signal S through a radial passage 302, that is to say with a main direction oriented towards the centre of the opening, perpendicular to the axis of the opening and parallel to said plane P, said first zone of the transparent or translucent element extends towards the rear (or towards the lower part of the assembly) in such a way as to at least pass through the plane including said main direction in order to capture said luminous signal and be able to propagate it to the upper part of the assembly. The same will apply for each light-emitting diode of the device. The luminous signal is emitted exclusively through each radial passage formed in the platform and is guided by said passage in this radial direction. It is not a question of also guiding the signal via another (for example axial) passage formed in the platform.

In other words, the element 40 made of transparent or translucent material makes it possible to propagate a signal emitted at the rear of the wall to the front of the wall. In its first zone, the element made of transparent or translucent material extends over a zone that is strictly greater than the thickness of the wall 2.

Each element 40 made of translucent material is intended to receive the luminous signals emitted by each light-emitting diode 320 of the visual signalling device with a view to propagating them from below the wall 2 to above the wall 2.

The assembly may include a single element 40 made of translucent or transparent material and formed of a single one-piece component.

The element 40 made of translucent material may have various configurations and various particular features. These configurations or particular features will in particular be linked to the type of material used to form the body of the control and/or display unit, the latter being able to be made of plastic and/or metal material.

- It may be a component moulded over the body of the control and/or display unit, over at least a part of the height of the latter, including the bezel of said body. This solution may be envisaged if the body is metallic.
- It may involve localized depositions that fill cavities, channels or recesses formed in the body of the unit. This solution may be envisaged if the body is metallic. The depositions will for example be made from translucent or transparent plastic material. They may be of different colours.
- It may be a component, for example made of flexible material, such as silicone or rubber, into which the body 10 of the unit is driven, so as to closely match the external form of said body and its bezel 100.
- It may be the body 10 of the control and/or display unit, thereby then making it possible to propagate the light to the central axis of the unit. This solution will be preferred in the case where the body is made of plastic material. This solution will be particularly advantageous for a display unit, that is to say an indicator, provided with a translucent cap at the top thereof through which the light is spread.
- It may be a combination of various solutions outlined above.

The assembly may include a plurality of elements 40 made of translucent or transparent material and arranged in a manner such that they are each able to perform the function of propagating a separate luminous signal. The various elements are for example distributed around the body of the control and/or display unit. This architecture has an advantage when the diodes are controlled independently, thus making it possible to provide localized lighting. Each element made of translucent or transparent material will make it possible for example to indicate a separate position of a rotary button. The elements may have separate colours, making it possible to signal different operating states of the unit.

According to the configuration of the element 40, it is to be noted that the opening through the wall 2 may be formed with a diameter greater than that normally used for a unit not equipped with the element made of translucent material. The presence of the element made of translucent material may thus accentuate the maximum external diameter of the unit at the opening of the wall.

Each luminous signal S emitted by the device propagates, by way of successive reflections, through the element made of translucent or transparent material, from its first zone situated facing a light-emitting diode to its second zone, in such a way as to emerge above the bearing plane and thus spread the emitted light towards the outside. The propagation will be facilitated all the more when the element 40 is positioned on an opaque surface.

The assembly of the invention is thus implemented in the following manner:

- The control and/or display unit is inserted through the opening formed in the wall 2, such that its bezel 100 comes to bear against the external face 20 of the wall 2, the lower part of the body of the unit being situated below said bearing plane and covered by said wall.
- The platform 300 of the visual signalling device is threaded around the body 1 of the unit, by screwing or by simple translation, for example until coming into abutment against the internal face 21 of the wall. In the case where the platform is screwed, the latter also fastens the unit. In the case of translation, the latter is for example held so as to bear against the internal face 21 of the wall by the conventional clamping ring 15, customarily used for fastening the unit.
- The electrical connection block 31 is connected to the visual signalling assembly 32 of the device. Depending on the configuration, the electrical connection block 31 is fastened to the platform 300 or to the baseplate 13. In the first case, the electrical connection is direct, without a linking cable, between the electrical terminals of the connection block and the electrical terminals of the visual signalling assembly. In the second case, an electrical linking cable 309 ensures the electrical connection between the electrical terminals of the electrical connection block 31 and those of the visual signalling assembly 32.

FIGS. 1A to 1D illustrate various operating variants of the visual signalling device of the invention, arranged on a control and/or display unit.

In FIG. 1A, the device of the invention interacts with a control unit, such as for example a pushbutton. The device is for example formed in accordance with the first embodiment described above in connection with FIGS. 2A to 2C. The diodes 320 are thus arranged so as to generate luminous signals in a mainly radial direction. The element 40 made of translucent or transparent material is formed at least partly by the body 10 of the control unit, incorporating its bezel 100. The luminous signal S generated by each light-emitting diode 320 is emitted mainly in the radial direction towards the first zone of the element made of translucent material, which zone is situated opposite, and propagates in the latter to its second zone situated at the level of the upper part of the control unit. Said luminous signal is conveyed as far as the bezel 100, making it possible to illuminate the latter.

Figure 1B:
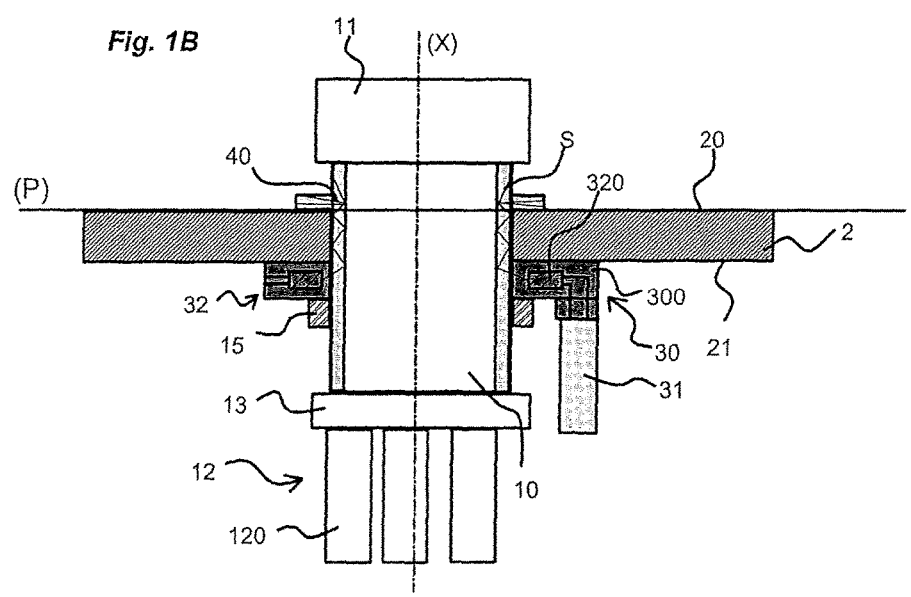

In FIG. 1B, the device of the invention interacts with a control unit of emergency stop button type. In this implementation, the element 40 is formed at least partly by the body 10 of the unit and extends in a first zone facing each light-emitting diode 320, which provides lighting in a main radial direction, and extends in its second zone above the bezel 100. The luminous signal S generated by each light-emitting diode 320 is then spread both to the bezel 100 and above the latter, making the unit visible in a front and side view.

In FIG. 1C, the device of the invention interacts with a control unit of pushbutton type. The device used is in accordance with the one described according to the second embodiment. It thus includes an axial lighting mode. The element 40 made of translucent or transparent material is formed at least partly by the body of the unit. The axial lighting makes it possible to illuminate the bezel 100 of the unit from below.

In FIG. 1D, the device of the invention interacts with a display unit or with a control unit of pushbutton type, having a transparent or translucent cap 14. The device is chosen in accordance with the first embodiment, with light-emitting diodes emitting in a radial main direction. The element 40 is formed at least partly by the body of the unit and the cap is also transparent or translucent. The luminous signal generated by each light-emitting diode passes entirely through the body 10 of the unit and spreads through the cap 14, thus making it possible to obtain central lighting, in addition to an axial lighting solution present in the unit or as a replacement therefor.

Based on the various configurations presented above, FIGS. 4A to 6C show the visual signalling device of the invention arranged on various types of control and/or display unit.

Figure 4A:
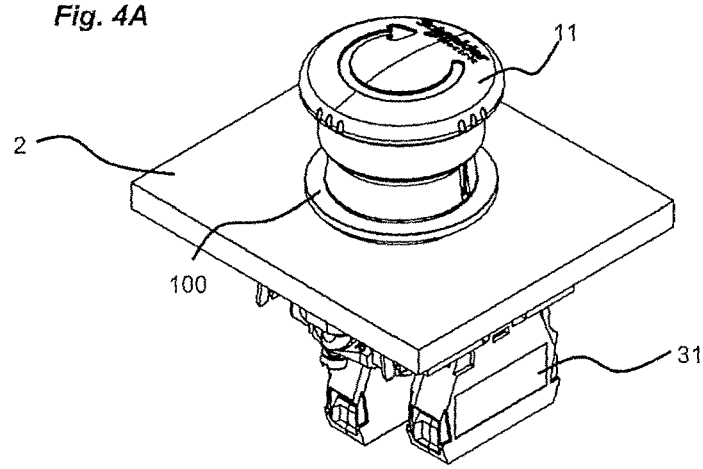
FIGS. 4A to 4C show the device of the invention in association with a control unit of emergency stop button type.
Figure 4B:
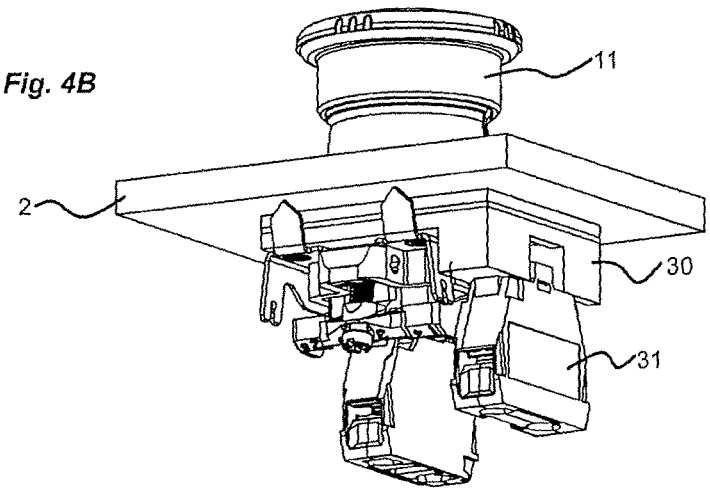
Figure 4C:
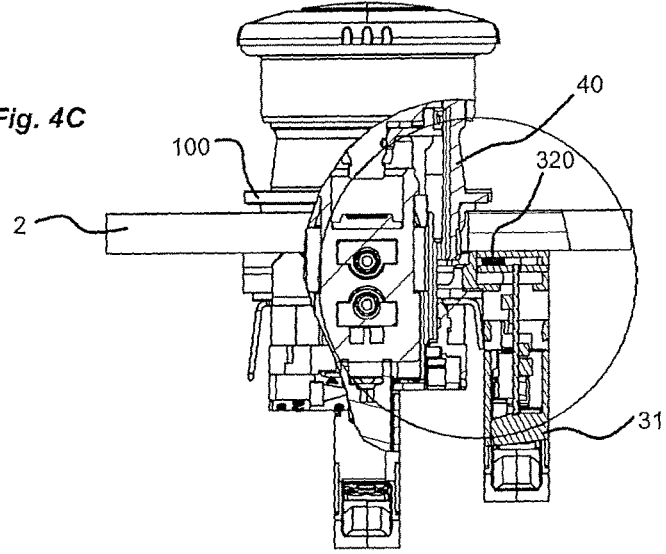

In FIGS. 4A to 4C, the device is associated with a control unit of emergency stop button type. It is held against the internal face 21 of the wall 2 by fastening means of the button. The lighting is radial and spreads through the body 10 of the button, over the entire height thereof, as in FIG. 1B described above. The body 10 is for example formed of an assembly of metal and of plastic. It will involve for example moulding of the element made of translucent or transparent material over a metal body. It could also be a metal body having certain cavities or recesses filled with a translucent or transparent plastic material.

Figure 5A:
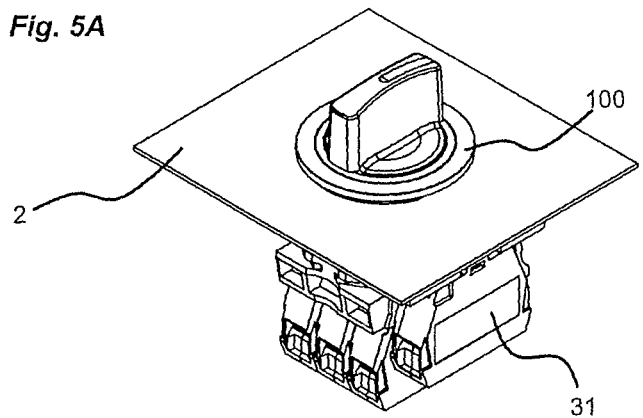
FIGS. 5A to 5C show the device of the invention in association with a control unit of rotary button type.
Figure 5B:
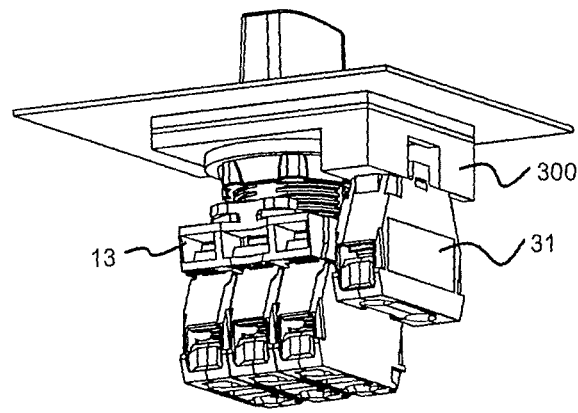
Figure 5C:
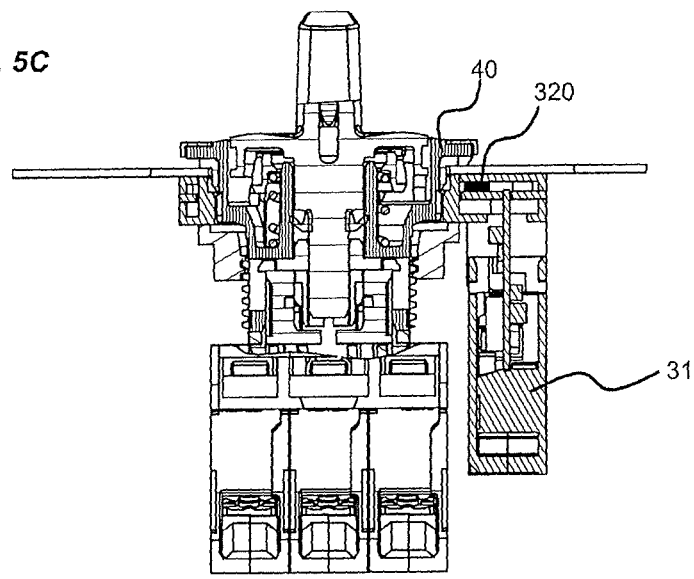

In FIGS. 5A to 5C, the device is associated with a control unit of rotary button type. The lighting is also radial and is spread by the body 10 of the button. It makes it possible to light the bezel 100 of the button, which bezel is situated against the external face 20 of the wall.

Figure 6A:
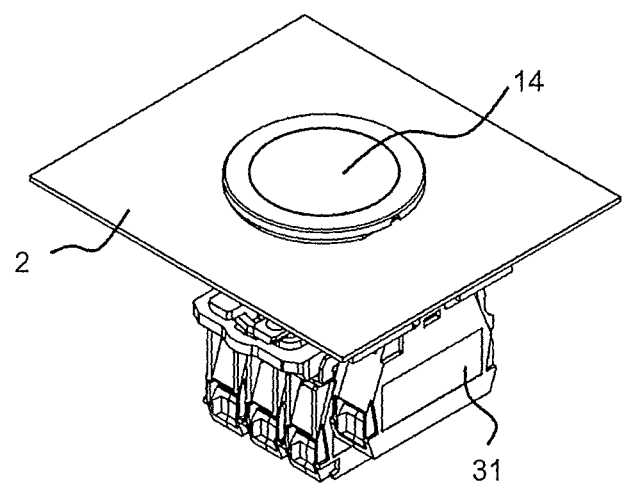
FIGS. 6A to 6C show the device of the invention in association with a display unit.
Figure 6B:
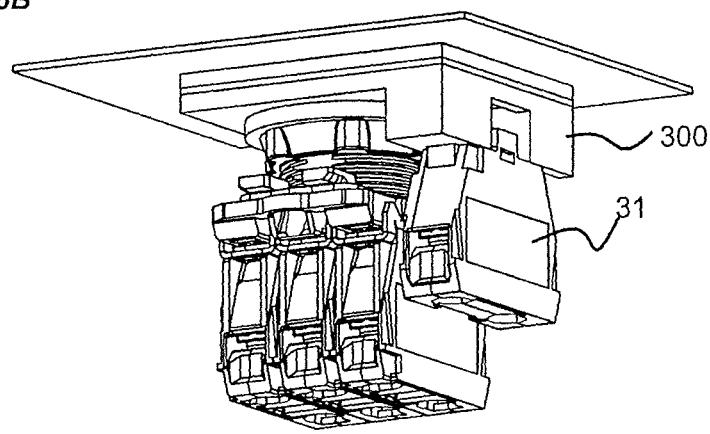
Figure 6C:
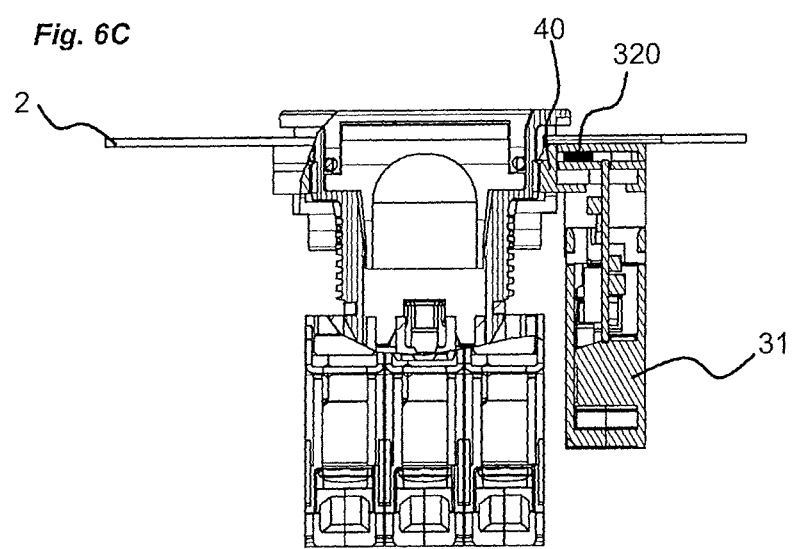

In FIGS. 6A to 6C, the device is associated with a display unit provided with a transparent cap 14. The body 10 of the unit is made from a translucent or transparent material, making it possible to allow the luminous signals generated by the light-emitting diodes 320 to pass through. The luminous signals thus propagate to the centre of the unit, and are spread through the cap.

It may be seen from the above description that the visual signalling device of the invention has many advantages:

- It makes it possible to obtain significant lighting, with limited bulk on the part of the unit.
- It is independent of the unit, thus enabling it to be easily replaced and enabling the client to choose at any time if he wishes to add a visual signalling means.
- It is compatible with various types of unit, the only obligation being the presence of the element made of translucent material.
- It makes it possible to provide various types of lighting that are variable in terms of colour and in terms of position, depending on the configuration of the device (diodes of different colours for example) and of that of the elements 40 that are used to propagate the luminous signals.

With a radial lighting solution, it enables a reduction in bulk in terms of height towards the rear of the wall, without impairing the quality of the lighting obtained in front of the wall.

The invention claimed is:

1. A visual signalling device for a control and/or display unit provided with a body and configured to be mounted through an opening formed in a wall, the device comprising:
   a support element including a platform having an opening configured to be passed through by the body of said control and/or display unit, and a first face configured to abut a face of the wall,
   a visual signalling assembly provided on the first face of said platform and including at least one light-emitting diode configured to produce a luminous signal, the at least one light-emitting diode being fully recessed with respect to the first face, and
   an electrical connection block configured to supply power to said visual signalling assembly,
   wherein said platform includes at least one radial passage configured to receive and pass therethrough said luminous signal emitted from said at least one light-emitting diode, and
   wherein said at least one light-emitting diode is oriented such that said luminous signal has a main direction situated in a plane that is transverse with respect to an axis of the opening.

2. The device according to claim 1, wherein said platform includes a recess formed at the periphery of the opening and in which said visual signalling assembly is housed.

3. The device according to claim 1, wherein the visual signalling assembly includes an electronic board to which said at least one light-emitting diode is soldered.

4. The device according to claim 1, wherein the opening has a circular outline.

5. The device according to claim 1, wherein said platform includes fastening means for interacting with corresponding fastening means of the electrical connection block.

6. The device according to claim 1, further comprising a clamping ring integral with said platform.

7. A control and/or display assembly, comprising:
   a control and/or display unit including:
      a body defined along the axis,
      a control and/or display head mounted on said body, the control and/or display unit having a bezel configured to bear against a first face of a wall, termed an external face, defining a bearing plane, and
      the visual signalling device according to claim 1, said support element of which interacts with said body of the control and/or display unit,
   an element made of translucent or transparent material and configured to receive said luminous signal and to propagate said luminous signal, and
   said element made of translucent or transparent material includes a first zone arranged facing the radial passage through which said at least one light-emitting diode emits said luminous signal, for receiving said luminous signal below said bearing plane, and a second zone extending from the first zone as far as the bearing plane or above the bearing plane.

8. The assembly according to claim 7, wherein said element made of translucent or transparent material is formed of a component moulded over the body of said control and/or display unit.

9. The assembly according to claim 7, wherein said element made of translucent or transparent material is formed at least partly by the body of said control and/or display unit.

10. The assembly according to claim 7, further comprising a clamping ring configured to hold the visual signalling device so that the visual signalling device bears against a second face of the wall, termed an internal face, opposite said external face.

* * * * *